(12) United States Patent
Uemura

(10) Patent No.: US 9,729,249 B2
(45) Date of Patent: Aug. 8, 2017

(54) AMPLIFICATION CIRCUIT

(71) Applicant: KABUSHIKI KAISHA TOSHIBA, Minato-ku, Tokyo (JP)

(72) Inventor: Hiroshi Uemura, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/981,684

(22) Filed: Dec. 28, 2015

(65) Prior Publication Data

US 2017/0054424 A1 Feb. 23, 2017

(30) Foreign Application Priority Data

Aug. 17, 2015 (JP) ................. 2015-160468

(51) Int. Cl.
| | |
|---|---|
| *H04B 10/61* | (2013.01) |
| *H04B 10/564* | (2013.01) |
| *H03F 3/08* | (2006.01) |
| *H03F 1/02* | (2006.01) |
| *H03G 3/30* | (2006.01) |

(52) U.S. Cl.
CPC ......... *H04B 10/616* (2013.01); *H03F 1/0205* (2013.01); *H03F 3/082* (2013.01); *H03G 3/3047* (2013.01); *H03G 3/3073* (2013.01); *H03G 3/3084* (2013.01); *H04B 10/564* (2013.01); *H03F 2200/129* (2013.01)

(58) Field of Classification Search
None
See application file for complete search history.

(56) References Cited

U.S. PATENT DOCUMENTS 4,166,985 A * 9/1979 White ................ H01S 5/06835
372/30
8,199,858 B2   6/2012 Kurooka et al.

FOREIGN PATENT DOCUMENTS

| JP | 05075544 A | 3/1993 |
|---|---|---|
| JP | 2006203338 A | 8/2006 |
| JP | 2007074427 A | 3/2007 |

* cited by examiner

*Primary Examiner* — Darren E Wolf
(74) *Attorney, Agent, or Firm* — Holtz, Holtz & Volek PC

(57) ABSTRACT

According to one embodiment, an amplification circuit includes an amplifier having a gain based on a gain control signal and amplifying an input signal by the gain, and a control portion outputting the gain control signal for increasing the gain after decreasing the gain based on an amplitude of the input signal, when the amplitude of the input signal is detected.

19 Claims, 16 Drawing Sheets

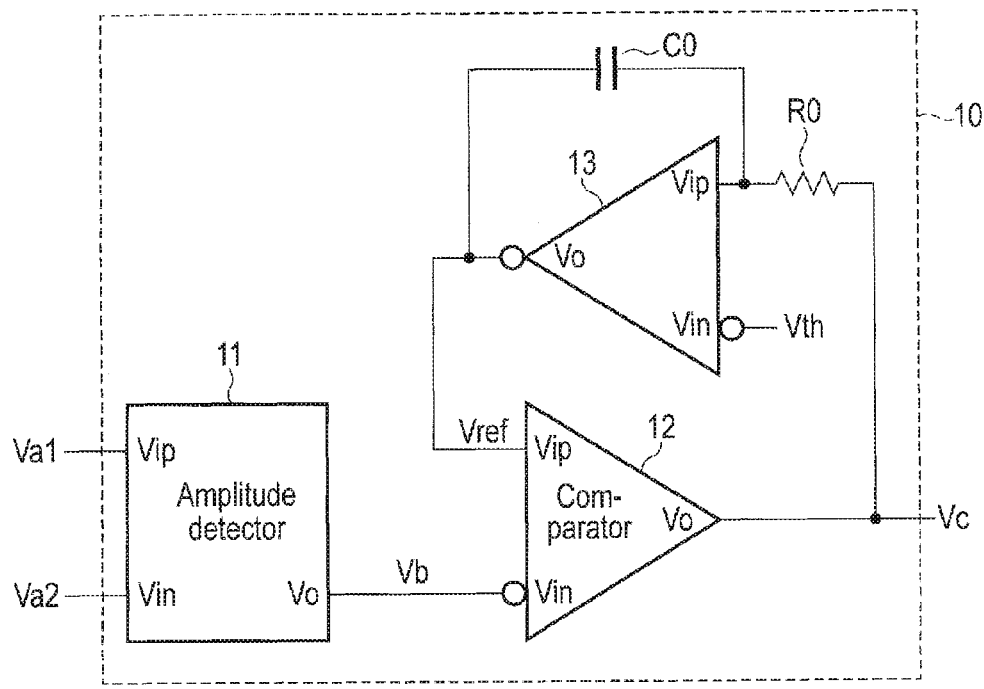
F I G. 4
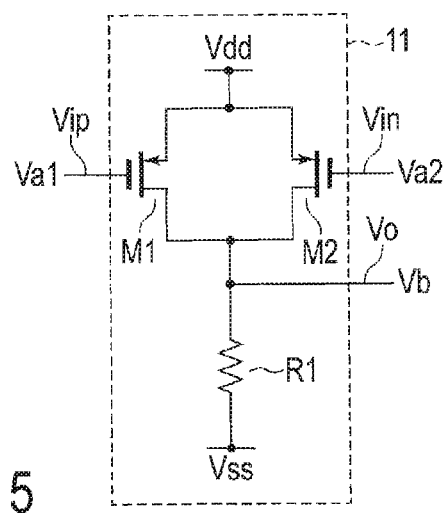
F I G. 5

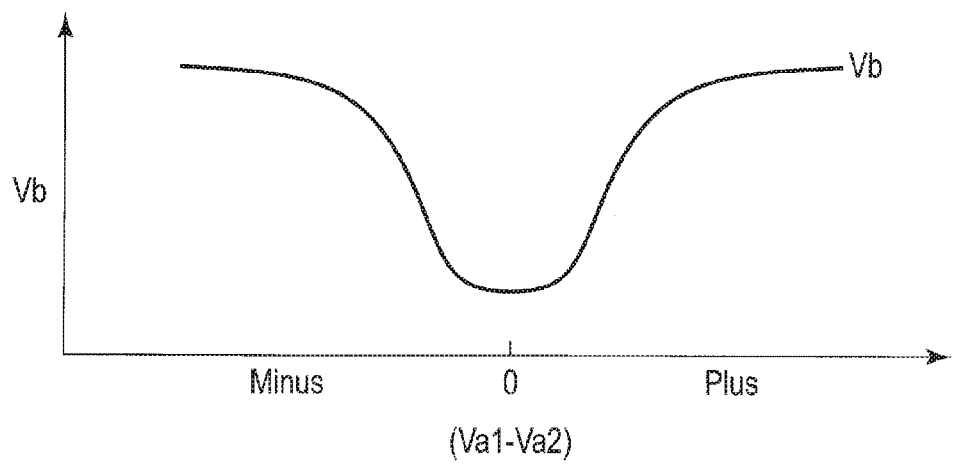
F I G. 6
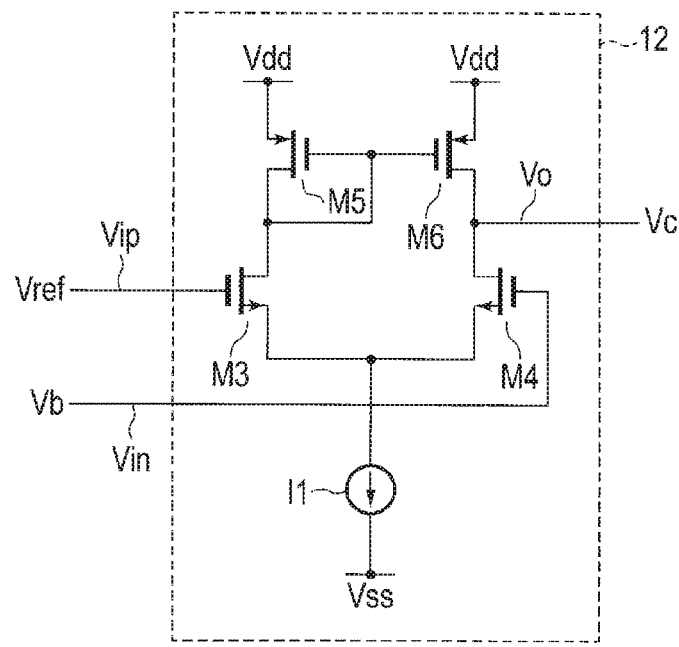
F I G. 7

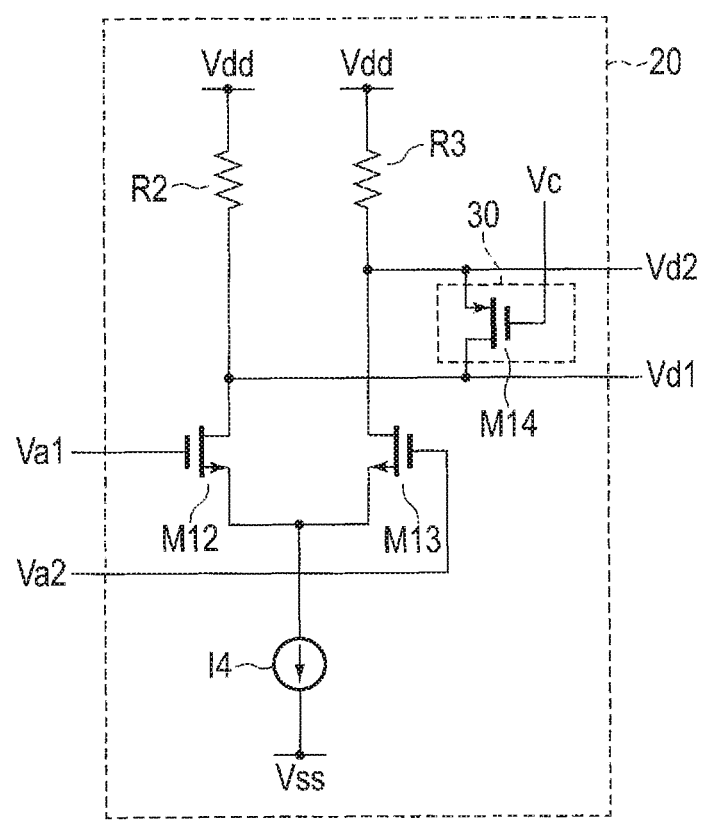
F I G. 10

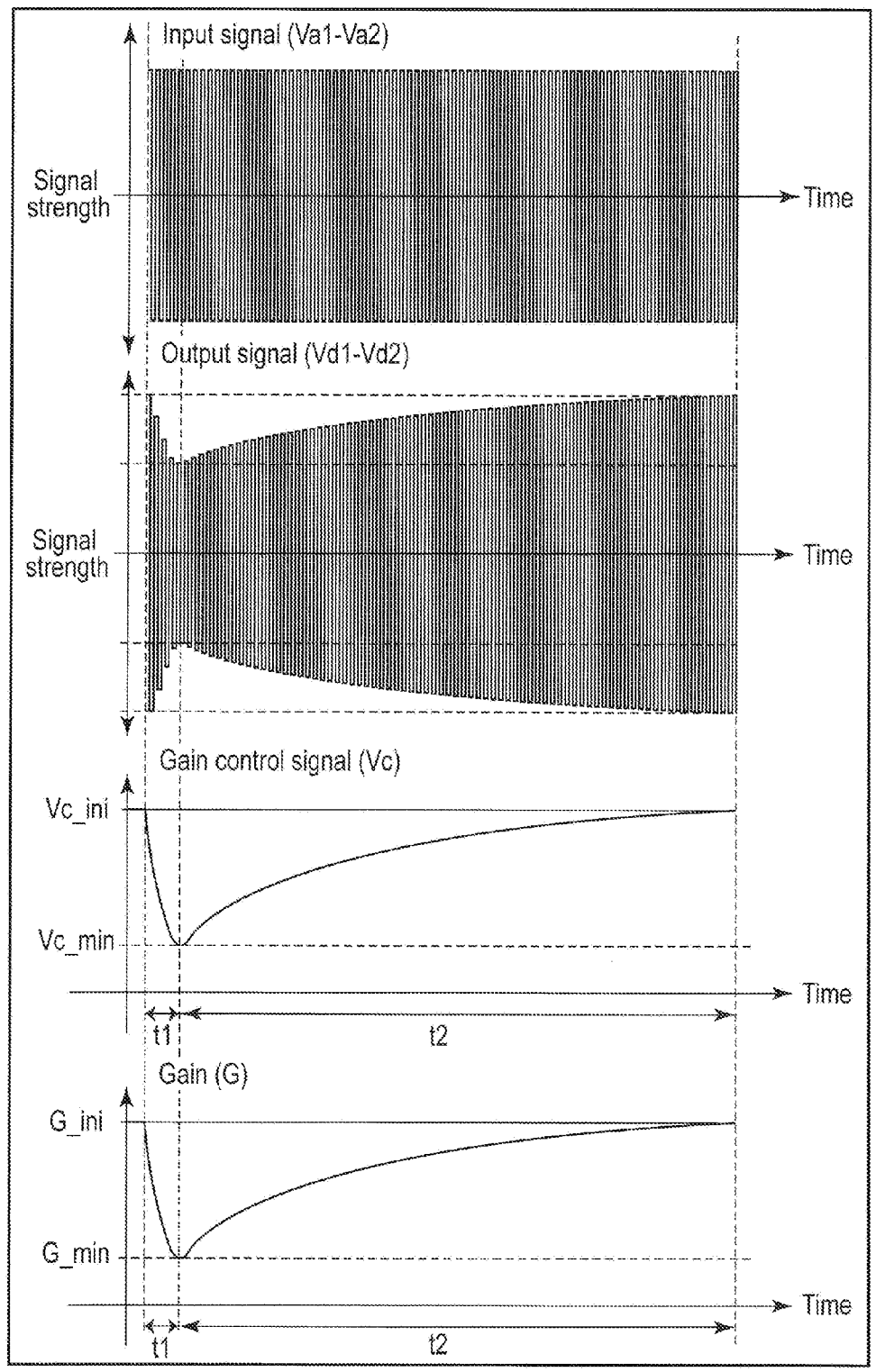
F I G. 11

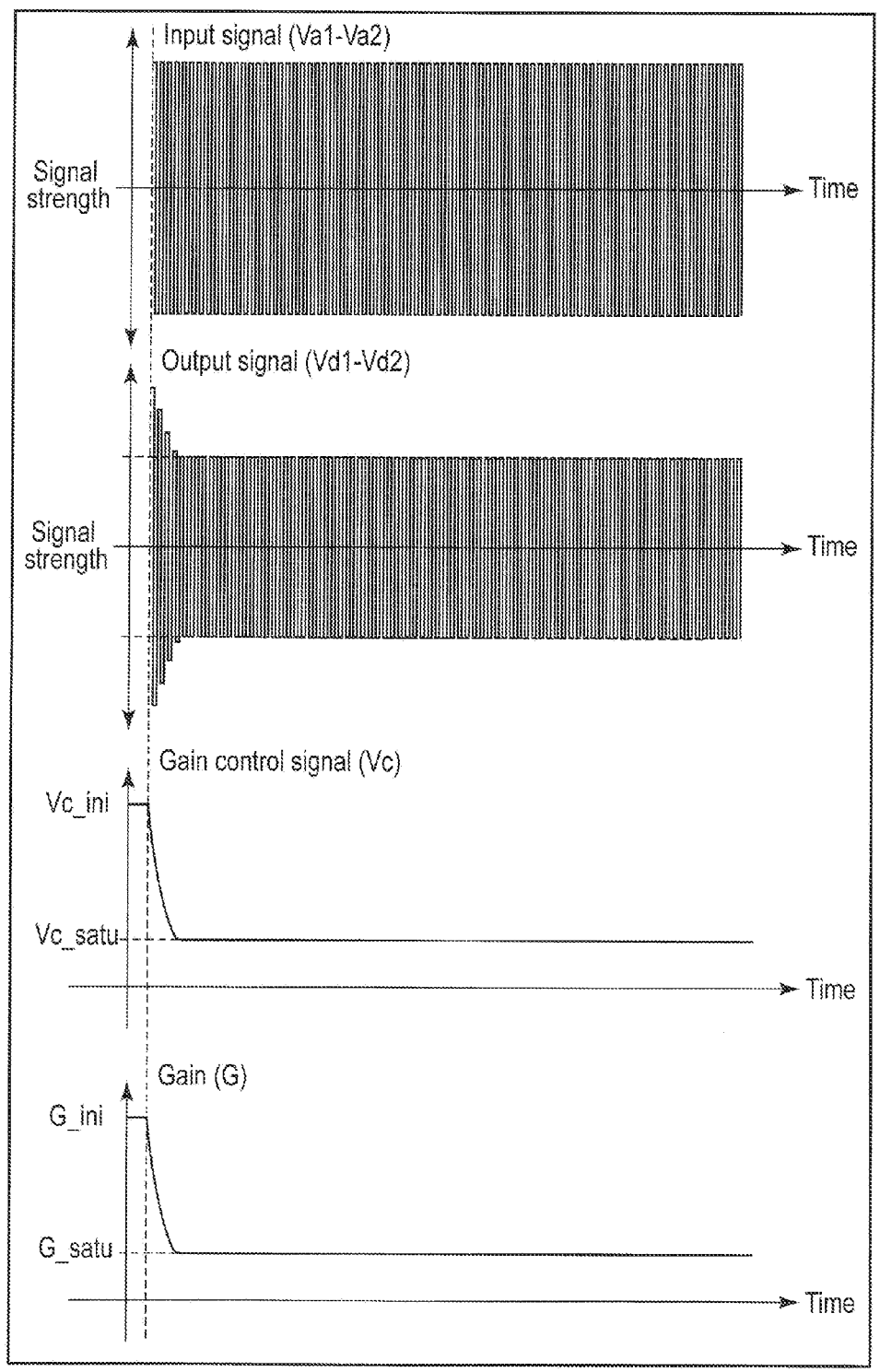
F I G. 12

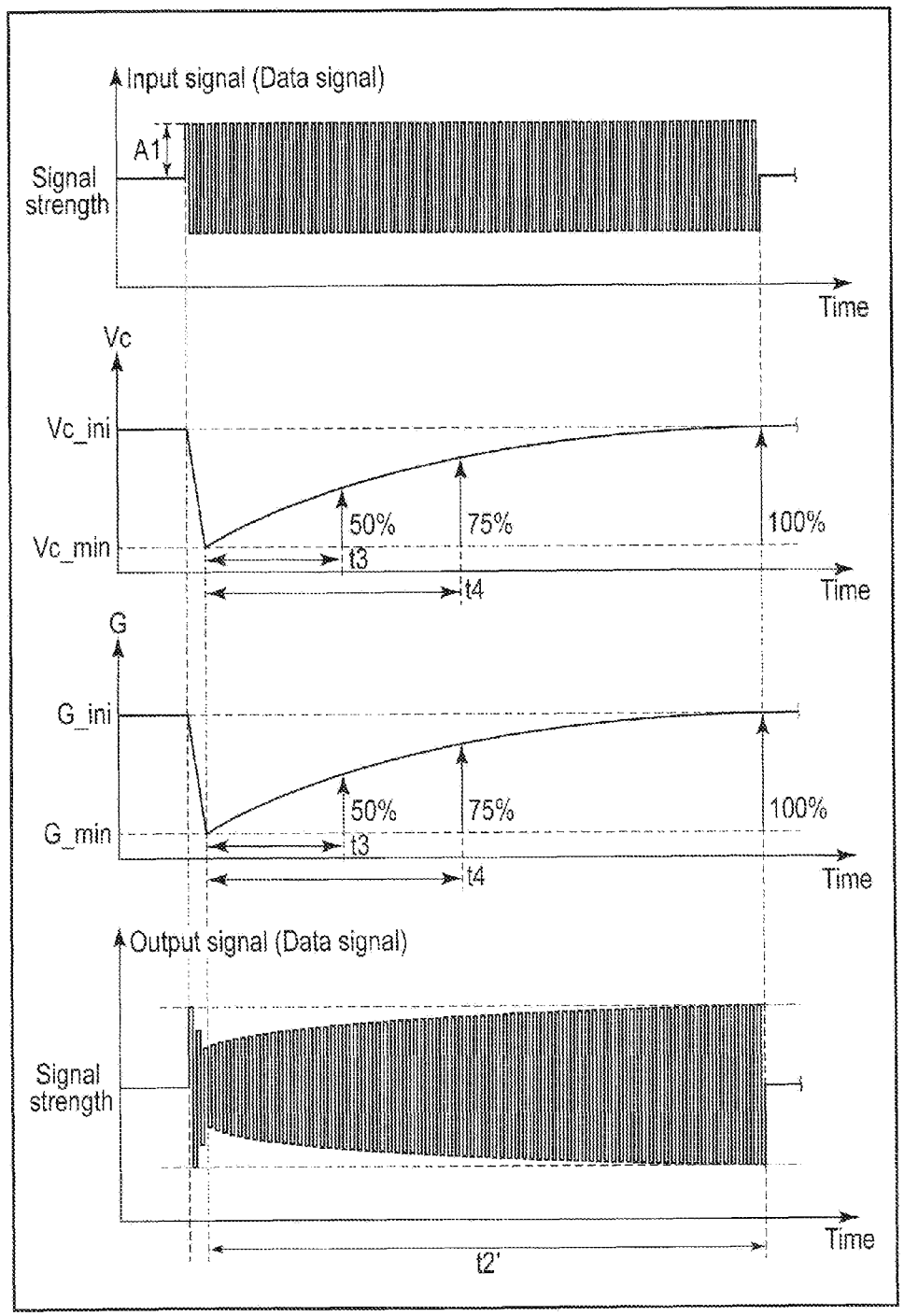
F I G. 14

AMPLIFICATION CIRCUIT

CROSS-REFERENCE TO RELATED APPLICATIONS

This application is based upon and claims the benefit of priority from Japanese Patent Application No. 2015-160468, filed Aug. 17, 2015, the entire contents of which are incorporated herein by reference.

FIELD

Embodiments described herein relate generally to an amplification circuit.

BACKGROUND

As information technology progresses and technical advances are made in electronic devices, data communication devices have been steadily improving in signal transmission speed. As a result, there is increasing demand for an amplifier for high-speed signal transmission.

BRIEF DESCRIPTION OF THE DRAWINGS

FIG. 4 is a diagram showing an example of a gain control signal generator.

FIG. 5 is a diagram showing an example of an amplitude detector.

FIG. 6 is a diagram showing an example of the input and output characteristics of the amplitude detector of FIG. 5.

FIG. 7 is a diagram showing an example of a comparator.

FIG. 10 is a diagram showing an example of an amplifier comprising a gain adjustment element.

FIG. 11 is a diagram showing an example of an input signal, an output signal, a gain control signal and a change in a gain with time.

FIG. 12 is a diagram showing a comparative example of an input signal, an output signal, a gain control signal and a change in a gain with time.

FIG. 14 is an explanatory diagram showing an application effect on a data signal.

DETAILED DESCRIPTION

In general, according to one embodiment, an amplification circuit comprises: an amplifier having a gain based on a gain control signal and amplifying an input signal by the gain; and a control portion outputting the gain control signal for increasing the gain after decreasing the gain based on an amplitude of the input signal, when the amplitude of the input signal is detected.

Embodiments will be described hereinafter with reference to the accompanying drawings.

(1) Example of Amplification Circuit

Figure 1:
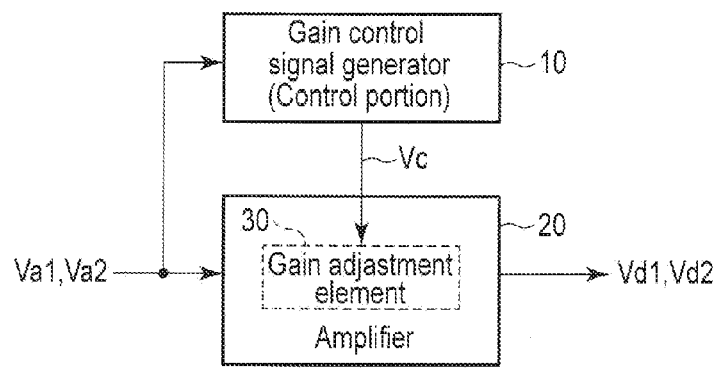
FIG. 1 is a diagram showing an example of an amplification circuit.

FIG. 1 is a diagram showing an example of an amplification circuit.

Input signals Va1 and Va2 are input to a gain control signal generator 10 and an amplifier 20.

Figure 2:
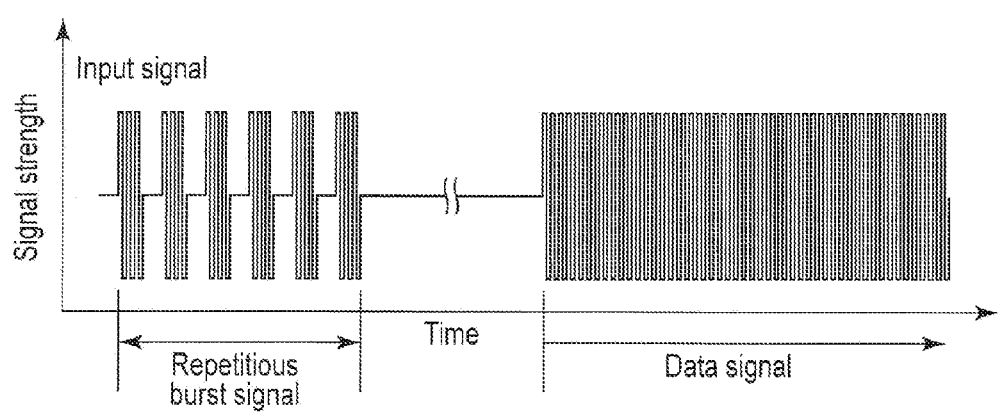
FIG. 2 is a diagram showing an example of an input signal.

Input signals Va1 and Va2 include, for example, a repetitious burst signal and a data signal as shown in FIG. 2. The repetitious burst signal is used for detecting a device (such as a solid-state drive [SSD]) from, for example, a system (such as a personal computer). The data signal is used, for example, for transmission speed adjustment (speed negotiation) and signal waveform adjustment (training) as well as for data transmission. That is, the system first detects the device using the repetitious burst signal. After that, by using the data signal, the system adjusts a transmission speed and a signal waveform and then transmits data.

The above-described burst signal includes, for example, an out-of-band (OOB) signal conforming to the Serial Advanced Technology Attachment (SATA) standard or the Serial-Attached SCSI [Small Computer System Interface] (SAS) standard, a low-frequency periodic signal (LFPS) conforming to the Universal Serial Bus (USB) standard, and a beacon signal conforming to the InfiniBand Standard.

Further, the above-described data signal includes, for example, a non-return-to-zero signal (NRZ) and a return-to-zero (RZ) signal.

Figure 3A:
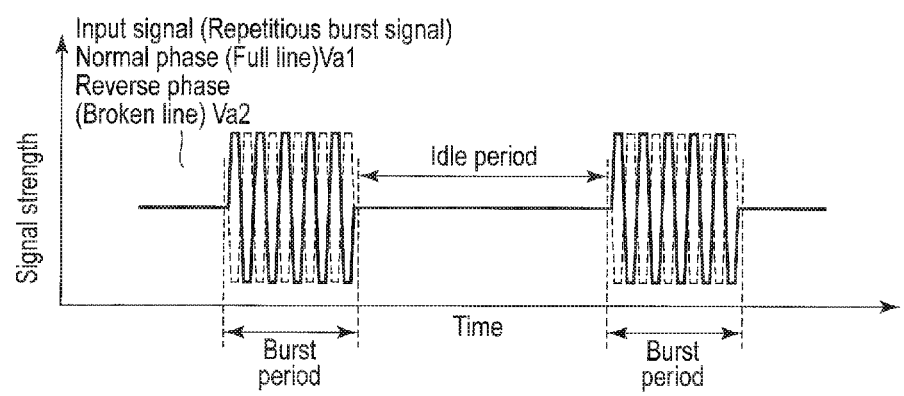
FIGS. 3A, 3B, 3C and 3D are diagrams showing examples of input signals.
Figure 3B:
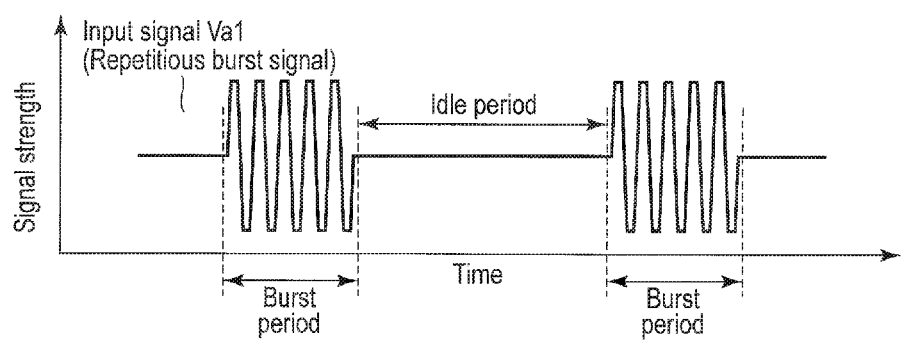

The repetitious burst signal (voltage signal) includes, as shown in FIGS. 3A and 3B, a burst period in which the signal repeatedly transitions between low and high (the pulse width of which is 1 ns and the period length of which is 100 ns, for example) and an idle period in which the signal remains unchanged at the intermediate level between low and high (the period length of which is 300 ns, for example). One repetitious burst signal includes, for example, six burst periods.

Figure 3C:
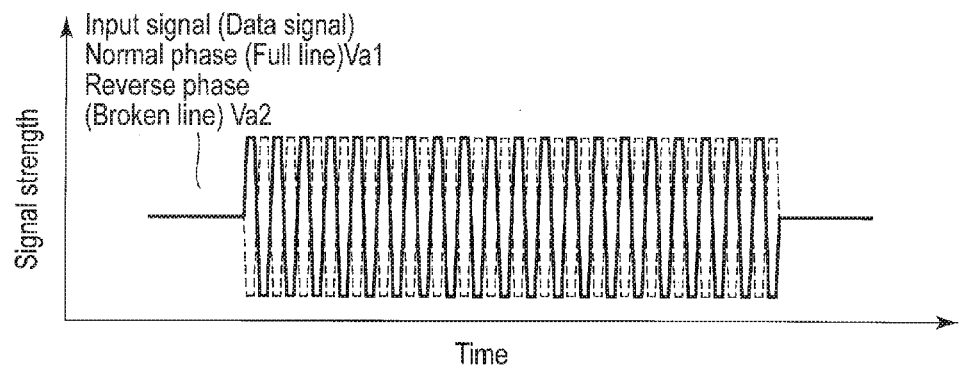
Figure 3D:
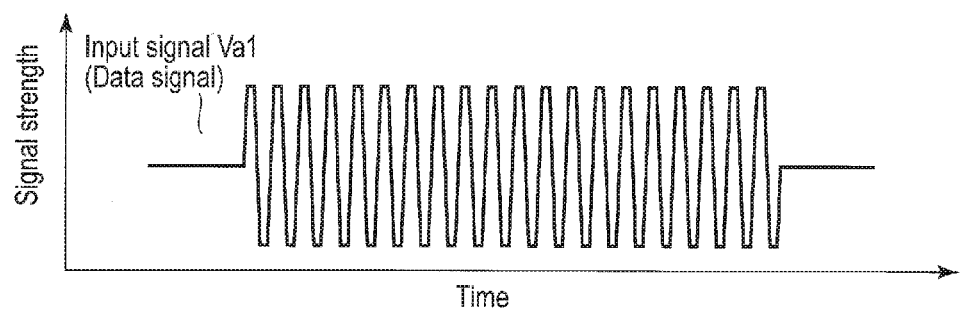

The data signal (voltage signal) includes, as shown in FIGS. 3C and 3D, a data period in which the signal transitions between low and high repeatedly. The length of the data period varies depending on an amount of data to be transmitted and is, for example, a greater than or equal to 10 ms. Since there are some cases where the data signal is used for adjusting a transmission speed and a signal waveform as described above, the data signal is not always entirely effective data.

In the present embodiment, an input signal is assumed to be a differential signal. In this case, for example, input signal Va1 is a normal phase signal Va1, and input signal Va2 is a reverse phase signal Va2 the phase of which is the inverse of that of the normal phase signal Va1 as shown in FIGS. 3A and 3C. Note that the above description is in no way restrictive and that, in a case where an input signal is a single-ended (single-phase) signal, for example, only input signal Va1 is input to the amplifier 20 as shown in FIGS. 3B and 3D.

The gain control signal generator 10 is configured to generate a gain control signal Vc based on input signals Va1 and Va2. The amplifier 20 is configured to amplify input signals Va1 and Va2 based on a gain controlled by the gain control signal Vc and outputs signals Vd1 and Vd2.

For example, the amplifier 20 comprises a gain adjustment element 30. The gain adjustment element 30 is configured to change the gain of the amplifier 20 based on the gain control signal Vc.

(2) Example of Gain Control Signal Generator

FIG. 4 is a diagram showing an example of the gain control signal generator.

The gain control signal generator 10 comprises an amplitude detector 11 configured to detect amplitudes of input signals Va1 and Va2, a comparator 12 configured to output the gain control signal Vc based on an output signal (detection signal) Vb of the amplitude detector 11 and a reference value (first reference value) Vref, and an operational amplifier 13 configured to output the reference value Vref based on an output signal (gain control signal) Vc of the comparator 12 and a threshold value (second reference value) Vth.

The amplitude detector 11, the comparator 12 and the operational amplifier 13 respectively comprise two input terminals Vip and Vin and one output terminal Vo.

The operational amplifier 13 comprises a resistor R0 connected to a non-inverting input terminal (Vip) and a capacitor C0 connected between the non-inverting input terminal and an inverting output terminal (Vo), thereby constituting an integrating circuit. That is, when the operational amplifier 13 has a sufficiently high gain, the following formula is satisfied, and consequently the operational amplifier 13 functions as an integrator configured to integrate a difference between the gain control signal Vc and the threshold value Vth with respect to a time constant CR and to output the result as the reference value Vref.

$$Vref = -\frac{1}{CR}\int_0^t (Vc - Vth)dt + Vth \quad (1)$$

FIG. 5 is a diagram showing an example of the amplitude detector.

The amplitude detector 11 comprises, for example, P-channel MOS transistors M1 and M2 and a resistor R1 connected between two power-supply terminals Vdd and Vss. That is, the amplitude detector 11 is an OR circuit using P-channel MOS transistors.

Power-supply terminal Vdd provides, for example, a power-supply voltage (1.2 V). Power-supply terminal Vss provides, for example, ground voltage (0 V). Further, a gate (control terminal) of P-channel MOS transistor M1 is connected to input terminal Vip which inputs input signal Va1. A gate of P-channel MOS transistor M2 is connected to input terminal Vin which inputs input signal Va2. The detection signal Vb is output from output terminal Vo between the drains of P-channel MOS transistors M1 and M2 and resistor R1.

An example of the input and output characteristics of the amplitude detector 11 of FIG. 5 is shown in FIG. 6.

Regardless of whether the input voltage (Va1−Va2) changes positively or negatively from zero, the output voltage Vb increases. Here, since input signals Va1 and Va2 are differential signals, the input voltage (Va1−Va2) changes between the first value and the second value having an absolute value the same as that of the first value and a sign reversed with that of the first value. Although the output voltage changes to follow the change of the input voltage, if the operating band of the amplitude detector 11 is lower than the signal bands of input signals Va1 and Va2, it is possible to make the output voltage Vb substantially a constant value based on the above-described first and second values. That is, the amplitude detector 11 can operate as a circuit configured to detect the amplitude of differential input signals.

Note that the amplitude detector 11 of FIG. 5 may comprise an N-channel MOS transistor with a gate applied a predetermined bias voltage in place of resistor R1. Further, if an input signal is a single-ended signal, it is desirable that the input signal be converted from a single-ended signal into a differential signal and then input to the amplitude detector 11 of FIG. 5.

The amplitude detector 11 of the present embodiment is, although having assumed to be an OR circuit of P-channel MOS transistors, not necessarily limited to this. For example, the amplitude detector 11 may be an OR circuit of N-channel MOS transistors. In that case, a resistor may be provided on the power-supply voltage Vdd side, and two N-channel MOS transistors may be provided on the ground Vss side in parallel.

In the OR circuit of N-channel MOS transistors, as the amplitude of differential input signals increases, output signals decrease. Therefore, it is necessary to make appropriate modifications respectively to the comparator 12, the operational amplifier 13, the amplifier 20 and the gain adjustment element 30 to realize amplifier gain adjustment which will be described later.

FIG. 7 is a diagram showing an example of the comparator.

The comparator 12 is a differential amplifier comprising N-channel MOS transistors M3 and M4 as input transistors, P-channel MOS transistors M5 and M6 connected in a current-mirror fashion as loads, and a current source I1.

A gate of N-channel MOS transistor M3 is connected to input terminal Vip, and a gate of N-channel MOS transistor M4 is connected to input terminal Vin. Further, a drain of N-channel MOS transistor M4 and a drain of P-channel MOS transistor M6 are connected to output terminal Vo. Current source I1 is, for example, an N-channel MOS transistor with a gate applied a predetermined bias voltage.

Figure 8:
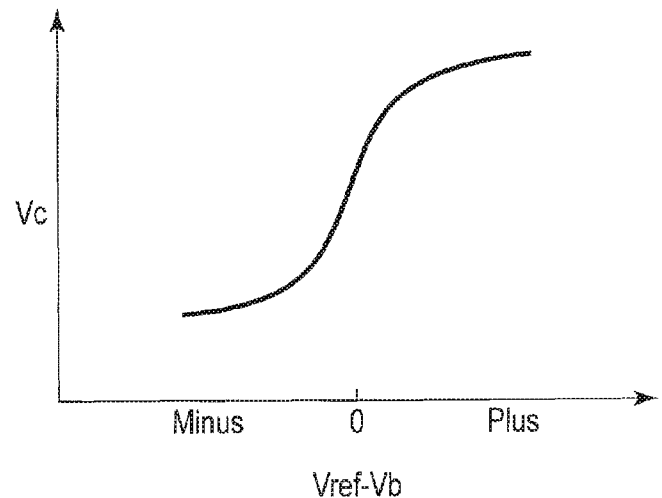
FIG. 8 is a diagram showing an example of the input and output characteristics of the comparator of FIG. 7.

FIG. 8 is a diagram showing an example of the input and output characteristics of the comparator of FIG. 7.

According to the present embodiment, as the input voltage (Vref−Vb) increases, the output voltage Vc increases accordingly, and as the input voltage (Vref−Vb) decreases, the output voltage Vc decreases accordingly. That is, the comparator of FIG. 7 can operate as a circuit configured to output the result of comparison between two input terminals Vip and Vin.

Note that terminal Vip which inputs the reference value Vref and terminal Vin which inputs the detection signal Vb may be switched with each other. In that case, however, a change in the voltage of the gain control signal Vc with respect to a change in the detection signal Vb occurs in a direction opposite to that of the present embodiment (FIG. 8). Therefore, it is necessary to make appropriate modifications respectively to the amplitude detector 11, the operational amplifier 13, the amplifier 20 and the gain adjustment element 30 to realize the amplifier gain adjustment which will be described later.

Further, the comparator 12 may be a differential amplifier comprising P-channel MOS transistors as input transistors and N-channel MOS transistors connected in a current-mirror fashion as loads. In that case also, it is necessary to make appropriate modifications respectively to the amplitude detector 11, the operational amplifier 13, the amplifier 20 and the gain adjustment element 30 to realize the amplifier gain adjustment which will be described later.

Figure 9:
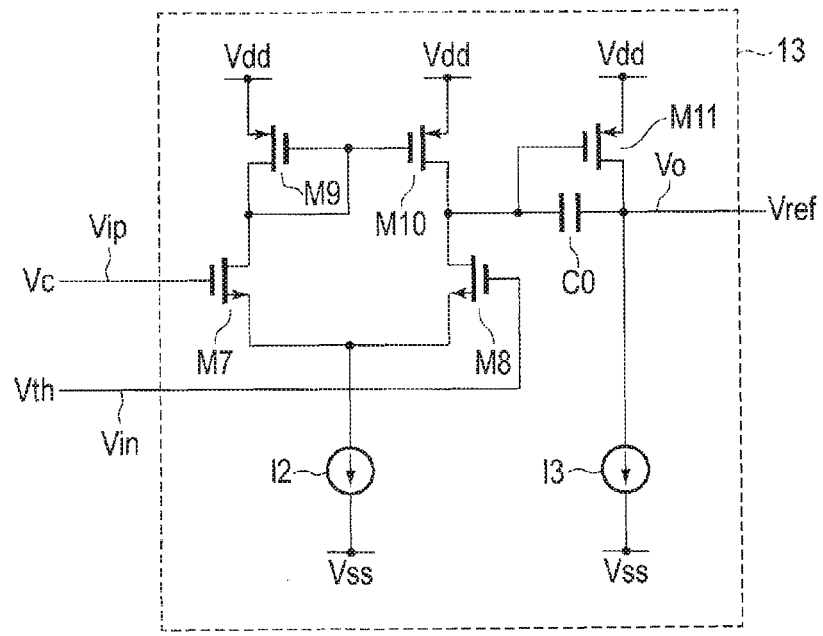
FIG. 9 is a diagram showing an example of an operational amplifier.

FIG. 9 is a diagram showing an example of the operational amplifier.

The operational amplifier 13 comprises a differential amplifier including N-channel MOS transistors M7 and M8 as input transistors, P-channel MOS transistors M9 and M10 connected in a current-mirror fashion as loads, and a current source I2, and further comprises a common source amplifier connected at the subsequent stage and including a P-channel MOS transistor M11 and a current source I3. The operation amplifier 13 as a two-stage amplifier has a high gain (of, for example, 60 dB) and can function as an operational amplifier. Note that a capacitor C0 connected between a gate and a drain of P-channel MOS transistor M11 is a capacitor for phase compensation.

A gate of N-channel MOS transistor M7 is connected to input terminal Vip, and a gate of N-channel MOS transistor M8 is connected to input terminal Vin. Further, a drain of N-channel MOS transistor M8 and a drain of P-channel transistor M10 are connected to a gate of P-channel MOS transistor M11.

P-channel MOS transistor M11 and current source I3 are connected in series between two power-supply terminals Vdd and Vss. The connection node of P-channel MOS transistor M11 and current source I3 is output terminal Vo.

Note that current sources I2 and I3 are, for example, N-channel MOS transistors with a gate applied a predetermined bias voltages.

FIG. 10 is a diagram showing an example of the amplifier.

The amplifier 20 is of a differential input type and comprises N-channel MOS transistors M12 and M13 configured to receive input signals Va1 and Va2, resistors R2 and R3, and a current source I4. Output signals Vd1 and Vd2 are output from the drains of N-channel MOS transistors M12 and M13. Note that, when an input signal is a single-ended signal, a reference voltage may be input to N-channel MOS transistor M13 or the input signal may be converted from a single-ended signal into differential signals at a step prior to the amplifier 20 and then input to the amplifier 20.

The amplifier 20 further comprises the gain adjustment element 30 configured to change the gain based on the gain control signal Vc. The gain adjustment element 30 is, for example, P-channel MOS transistor M14 connected between the drains of N-channel MOS transistors M12 and M13.

In the gain adjustment element 30 (M14), the resistance between the source and the drain changes in accordance with the gate voltage. More specifically, as the gate voltage decreases, the resistance between the source and the drain decreases, and as the gate voltage increases, the resistance between the source and the drain increases.

Here, the gain of the amplifier 20 (more specifically, a change in an output signal which occurs when an input signal changes slightly, namely, a small-signal gain) is roughly determined by multiplying the load resistance produced by the resistances of resistors R2 and R3, the resistance between the source and the drain of the gain adjustment element 30 (M14), and the output resistances of N-channel MOS transistors M12 and M13 by the transconductance of N-channel MOS transistors M12 and M13 (the change in a drain current which occurs when the gate voltage changes slightly).

Therefore, as the gate voltage of the gain adjustment element 30 (M14) decreases, the load resistance of the amplifier 20 decreases, and consequently the gain thereof decreases. Further, as the gate voltage increases, the load resistance of the amplifier 20 increases, and consequently the gain thereof increases.

The amplifier 20 of the present embodiment is, although assumed to be a single differential amplifier as shown in FIG. 10, not necessarily limited to this and may comprise a plurality of amplifiers internally.

In that case, the gain control of the amplifier 20 by the gain adjustment element may be executed on either all or some of the plurality of amplifiers in the amplifier 20. Further, the gains of the plurality of amplifiers may be controlled respectively by different gain control signals.

FIG. 11 is a diagram, showing an example of the input signal (Va1−Va2), the output signal (Vd1−Vd2), the gain control signal (Vc), and the change in the gain (G) of the amplifier 20 with time, according to FIGS. 1 and 4.

Input signals Va1 and Va2 are constant at the intermediate level between high and low at first and then transition between high and low repeatedly. The amplitudes of input signals Va1 and Va2 are determined by the system (interface standard) adopting the present embodiment or by the gain of the amplifier at the prior stage.

At first, when input signals Va1 and Va2 are constant at the intermediate level between high and low, the circuit is in equilibrium, and the gain control signal Vc has an initial value Vc_ini and the gain G has an initial value G_ini.

However, when the amplitudes of input signals Va1 and Va2 are detected, the output voltage Vb of the amplitude detector 11 increases. That is, since the inverting input signal of the comparator 12 increases, the non-inverting output signal of the comparator 12, namely, the gain control signal Vc rapidly decreases (to Vc_mini in time t1). Consequently, the gain G rapidly decreases (to G_mini in time t1). Further, the amplitude of the output signal (Vd1−Vd2) rapidly decreases.

Here, the integration circuit including the operational amplifier 13 integrates the difference between the gain control signal Vc and the threshold value Vth with respect to the time constant CR as shown in the formula (1), outputs the result of integration, and feeds it back to the non-inverting input terminal of the comparator 12. In this way, processing is executed to change the reference value Vref in such a direction as to decrease the difference between the time-averaged value of the gain control signal Vc and the threshold value Vth. That is, as the gain control signal Vc decreases, the inverting output signal of the operational amplifier 13, namely, the reference value Vref increases. Since the reference value Vref of the comparator 12 is the non-inverting input signal of the comparator 12, the non-inverting output signal of the comparator 12, namely, the gain control signal Vc gradually increases (to Vc_ini in time t2). Consequently, the gain G gradually increases (to G_ini in time t2). Further, the amplitude of the output signal (Vd1−Vd2) gradually increases accordingly.

As described above, when the amplitudes of input signals Va1 and Va2 are detected, the gain control signal generator (control portion) 10 of FIG. 4 first decreases the gain control signal Vc based on the amplitudes to decrease the gain G of the amplifier 20 of FIG. 10, and then increases the gain control signal Vc based on the output of the integration circuit to increase the gain G of the amplifier 20.

This is a distinctive feature of the present embodiment. In conventional gain control, as shown in FIG. 12, the gain control signal Vc decreases from the initial value Vc_ini to a saturation value Vd_satu and becomes constant at the level, and similarly, the gain G decreases from the initial value G_ini to a saturation value G_satu and becomes constant at the level. As a result, the amplitude of the output signal (Vd1−Vd2) decreases from the initial amplitude and becomes constant at the level.

On the other hand, in the present embodiment, the gain control signal Vc decreases from the initial value Vc_ini to the minimum value Vc_min and then increases toward the initial value Vc_ini again as shown in FIG. 11. Similarly, the gain G decreases from the initial value G_ini to the minimum value G_min and then increases toward the initial value G_ini again. As a result, the amplitude of the output signal (Vd1−Vd2) decreases from the initial amplitude and then increases toward the initial amplitude again.

It is preferable that the time (t1) in which the gain control signal Vc decreases from the initial Vc_ini to the minimum value Vc_min and the time (t1) in which the gain G of the amplifier 20 decreases from the initial value G_ini to the minimum value G_min be shorter than the burst period of a repetitious burst signal. Further, it is preferable that the time (t2) in which the gain control signal Vc increases from the minimum value Vc_min to the initial value Vc_ini and the time (t2) in which the gain G of the amplifier 20 increases from the minimum value, G_min to the initial value G_ini be longer than t1.

With this configuration, it becomes possible in the burst period of a repetitious burst signal not only to decrease the gain control signal Vc and the gain G sufficiently but also to keep the gain control signal Vc and the gain G low until the end of the burst period.

Note that it is possible to make t1 shorter, for example, by operating the amplitude detector 11 at higher speed and that it is possible to make t2 longer, for example, by increasing the time constant CR of the integration circuit including the operational amplifier 13.

The range of reduction (Vc_ini−Vc_min) in the gain control signal Vc and the range of reduction (G_ini−G_min) in the gain G increase as the amplitudes of input signals Va1 and Va2 increase. These reduction ranges can be set appropriately based on the amplitudes of input signals Va1 and Va2 and the gain of the whole circuit. For example, in the case of amplifying a signal having the minimum amplitude of the system adopting the present embodiment, the gain control may not be executed (Vc_ini−Vc_min=0, G_ini−G_min=0). Further, it is desirable in the case of amplifying a signal having the maximum amplitude of the system adopting the present embodiment that Vc_min be less than or equal to 50% of Vc_ini and G_min be less than or equal to 50% of G_ini. In this way, it is possible in the system adopting the present embodiment to deal with a signal having a wide range of amplitude from a signal having the minimum amplitude to a signal having the maximum amplitude.

Figure 13:
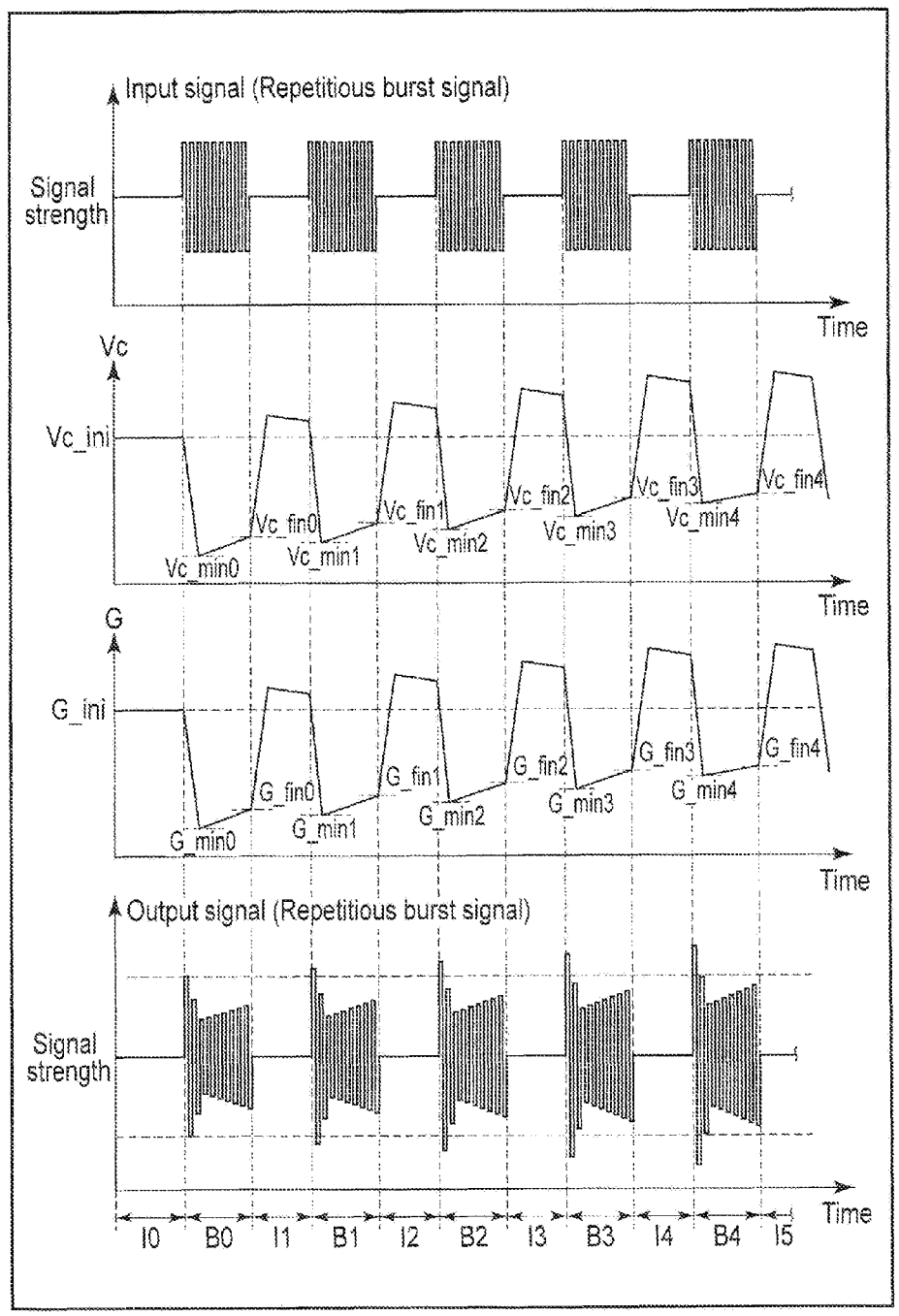
FIG. 13 is an explanatory diagram showing an application effect on a repetitious burst signal.

FIG. 13 is a diagram showing an application effect on a repetitious burst signal.

FIG. 13 shows the relationship, in the case of amplifying a repetitious burst signal (input signal), among the burst signal before, and after amplification, the gain control signal and the gain of the amplifier.

The repetitious burst signal has signal amplitude in burst periods B0, . . . , B4 and does not have signal amplitude in idle periods I0, . . . , I5. Therefore, the gain control signal Vc and the gain G decrease in burst periods B0, . . . B4 and increase in idle periods I0, . . . , I5.

As described above with reference to FIG. 11, the gain control signal Vc is controlled under the feedback control of the integration circuit including the operation amplifier 13 of FIG. 9 to make the time averaged value thereof approach the initial value Vc_ini. As a result, the gain control signal Vc decreases to the minimum values Vc_min0, . . . , Vc_min4 after respective burst periods B0, . . . , B4 start and then increase to the final values Vc_fin0, . . . , Vc_fin4 before respective burst periods B0, . . . , B4 end. Similarly, the gain G decreases to the minimum values G_min0, . . . , G_min4 after respective burst periods B0, . . . B4 start and then increases to the final values G_fin0, . . . , G_fin4 before respective burst periods B0, . . . , B4 end. Since the final values G_fin0, . . . , G_fin4 of the gain in respective burst periods B0, . . . , B4 are less than the initial value G_ini, the gain is adjusted sufficiently even at the ends of the burst periods.

As a result, it is possible to prevent or suppress an internal signal or an output signal of the amplifier from reaching the output limit (limit voltage) and thereby achieve high-speed signal level transition from the burst period (high or low) to the idle period (at the intermediate level between high and low), and consequently, highly-reliable repetitious burst signal transmission can be realized.

On the other hand, in the case of not adjusting the gain, an internal signal or an output signal of the amplifier reaches (becomes stuck on) the output limit and signal level transition from the burst period to the idle period becomes slow (a significant decay occurs), and consequently the idle period disappears. As a result, it becomes difficult to transmit the repetitious burst signal accurately, which leads to a problem in detecting a device.

In each of burst periods B0, B1, . . . , BN, it is preferable that the respective amounts of return from the minimum values to the final values in the gain control signal Vc and in the gain G be less than or equal to 50% of the respective amounts of reduction from the initial values to the minimum values in the gain control signal Vc and in the gain G, respectively. Thus, $$Vc\_finN - Vc\_minN \leq \tfrac{1}{2} \times (Vc\_ini - Vc\_minN) \quad (2)$$

and $$G\_finN - G\_minN \leq \tfrac{1}{2} \times (G\_ini - GminN), \quad (3)$$

where Vc_ini is the initial value of the gain control signal; G_ini is the initial value of the gain; Vc_min0, Vc_min1, . . . , Vc_minN are the minimum values of the gain control signal in respective burst periods B0, B1, . . . , BN; G_min0, G_min1, . . . , G_minN are the minimum values of the gain in respective burst periods B0, B1, . . . , BN; Vc_fin0, Vc_fin1, . . . , Vc_finN are the final values of the gain control signal in respective burst periods B0, B1, . . . , BN; and G_fin0, G_fin1, . . . , G_finN are the final values of the gain in respective burst periods B0, B1, . . . , BN.

In this way, the gain adjustment can be performed sufficiently even at the ends of the burst periods, and consequently the repetitious burst signal can be transmitted highly reliably.

FIG. 14 is a diagram showing an application effect on a data signal.

FIG. 14 shows the relationship in the case of amplifying a data signal (input signal), among the data signal before and after amplification, the gain control signal and the gain of the amplifier.

The data signal has signal amplitude at all times in contrast to the repetitious burst signal. When the amplitude of the data signal is detected, the gain control signal Vc decreases from the initial value Vc_ini to the minimum value Vc_min and the gain G decreases from the initial value G_ini to the minimum value G_min. Then, under the feedback control of the integration circuit, the gain control signal Vc increases toward the initial value Vc_ini, and the gain G increases toward the initial value G_ini.

Now, an example of the change in the gain control signal Vc will be described. When the amplitude of the data signal is detected, the gain control signal Vc decreases from the initial value Vc_ini (for example, 500 mV) to the minimum value Vc_min (for example, 52 mV). That is, the reduction range of the gain control signal Vc is 448 mV. The gain control signal Vc recovers to 276 mV corresponding to 50% of the difference between Vc_min and Vc_ini in a predetermined time (t3) after having reached the minimum value Vc_min, and further recovers to 388 mV corresponding to 75% of the difference between Vc_min and Vc_ini in a predetermined time (A) after having reached the minimum value Vc_min.

In the amplification of the data signal, as described above, the gain control signal Vc and the gain G are recovered to the respective initial values after temporarily reduced. In this way, an internal signal or an output signal of the amplifier reaches the output limit (limit voltage), and consequently the slew rate improves. As a result, it is possible to substantially improve the operating band of the amplification circuit and thereby achieve amplification of high-speed signals.

On the other hand, in conventional gain control, the gain control signal Vc and the gain G stay low after having decreased. Therefore, the slew rate in an internal signal or an output signal of the amplifier decreases in accordance with the operating band of the amplification circuit. Consequently, it has been difficult to amplify high-speed signals.

Figure 15:
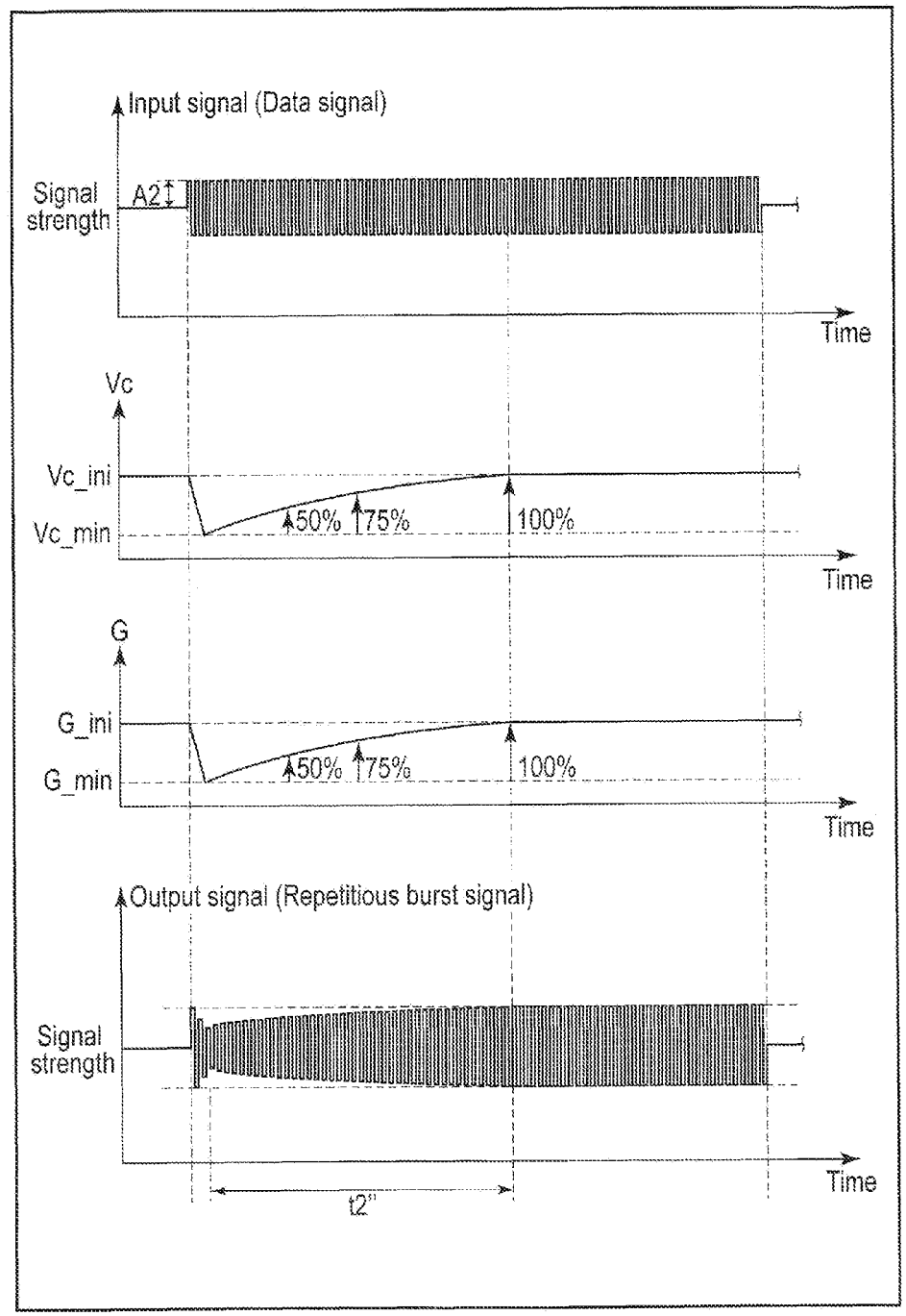
FIG. 15 is a diagram showing the relationship between amplitude of an input signal and change in a gain.

Note that the above-described t3 and t4 vary depending on the amplitude of an input signal. For example, the length of time required for the gain G to return to the initial value G_ini is t2' in the data signal (amplitude value A1) of FIG. 14, and on the other hand, the length of time required for the gain G to return to the initial value G_ini in the data signal (amplitude value A2) of FIG. 15 is t2". Note that A1>A2 and t2'>t2". Further, it should also be noted that the waveforms of the signals of FIGS. 14 and 15 are those obtained by using the same amplification circuit (for example, the amplification circuit of the above-described embodiment).

Here, as described above, a system first detects a device by using a repetitious burst signal. After that, the system adjusts a transmission speed and a signal waveform and then transmits data by using a data signal. In adjustment of a transmission speed and a signal waveform, if the gain of the amplification circuit is low under the gain control, it becomes difficult to amplify high-speed signals, and consequently there will be a danger that the transmission speed obtained as a result of adjustment becomes lower than necessary. Therefore, in adjustment of a transmission speed and a signal waveform, it is preferable to recover the gain under the feedback control. In this way, the substantive operating band of the amplification circuit improves, the transmission speed obtained as a result of adjustment becomes high, and consequently high-speed signal transmission can be achieved in the system.

For example, there are three transmission speeds (1.5 Gb/s, 3.0 Gb/s, 6.0 Gb/s) in the SATA standard, and each transmission speed requires an adjustment time of about 50 μs. Therefore, it is preferable to recover the gain within 1/10 of the adjustment time, that is, 5 μs under the feedback control. However, as described above, the time in which the gain control signal Vc returns from the minimum value Vc_min to the initial value Vc_ini and the time in which the gain G returns from the minimum value G_min to the initial value G_ini vary depending on the amplitude of the data signal. Therefore, in the case of amplifying a signal having the maximum amplitude in the system adopting the present embodiment, it is desirable that the above-described t3 be within 5 μs. In this way, it is possible in the system adopting the present embodiment to deal with a signal having a wide range of amplitude from a signal having the minimum amplitude to a signal having the maximum amplitude.

(3) Example of Application

An example of application of the above-described amplification circuit to a signal transmission system will be described below.

Recently, in order to realize high-speed signal transmission in signal transmission systems used for data communication devices, a method of amplifying an electrical signal in a signal transmission path and a method of performing signal transmission by converting an electrical signal into an optical signal have been considered. However, since signals are amplified in these methods, it is disadvantageously likely that repetitious burst signals and data signals cannot be transmitted accurately and consequently the reliability of signal transmission decreases significantly.

Here, by applying the above-described amplification circuit to these signal transmission systems, it is possible to realize highly-reliable high-speed signal transmission.

As an example of application, a signal transmission system of FIG. 16 will be described below.

Figure 16:
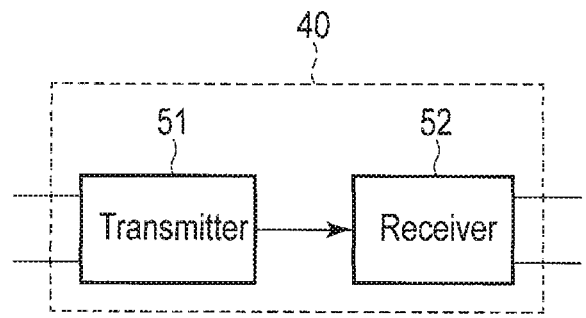
FIG. 16 is a diagram showing a signal transmission system as an application example.

The signal transmission system 40 of FIG. 16 comprises a transmitter 51 configured to transmit an electrical signal or an optical signal based on an electrical input signal, and a receiver 52 configured to receive an electrical signal or an optical signal and generate an electrical output signal. The electrical signal is transmitted by, for example, an electrical cable comprising a copper conductor. The optical signal is transmitted by, for example, an optical cable comprising an optical fiber.

Note that, although the present embodiment describes the case of transmitting signals in one direction by using a transmitter or a receiver, it is also possible to transmit signals in both directions by using a transceiver. In either case, there may be a single signal channel or may be a plurality of signal channels. Further, the number of signal channels in the transmission direction and the number of signal channels in the receiving direction may be different from each other.

<Example of Electrical Signal Transmission System>

First, an example of a signal transmission system using electrical signals will be described.

Figure 17:
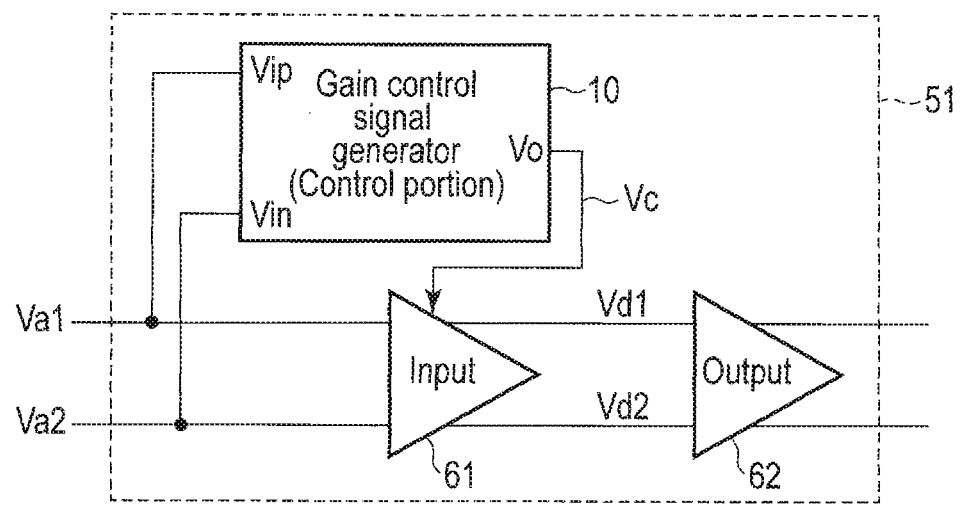
FIG. 17 is a diagram showing a transmitter for electrical signal transmission.

The transmitter 51 for electrical signal transmission comprises, for example, as shown in FIG. 17, an input circuit (input) 61 configured to receive and amplify input signals Va1 and Va2, and an output circuit (output) 62 configured to output signals based on output signals Vd1 and Vd2 of the input circuit 61.

Input signals Va1 and Va2 of the input circuit 61 are, for example, differential signals including a repetitious burst signal, and are capable of transmitting data of, for example, up to 10 Gbps.

The input circuit 61 is configured to amplify input signals Va1 and Va2 the minimum differential amplitude of which is 100 mV and generate output signals Vd1 and Vd2 the differential amplitude of which is 500 mV. That is, the interface circuit 63 has a gain of approximately 14.0 dB.

Further, the gain of the input circuit 61 is controlled by the gain control signal Vc from the above-described gain control signal generator. For example, the following description is based on the assumption that the gain gradually decreases when the input amplitude is 200 mV or more, and that the gain of the input circuit 61 obtained when the input amplitude is 400 mV is approximately 1.9 dB. With this configuration, it becomes possible to realize highly-reliable high-speed signal transmission as described above.

The output circuit 62 is configured to output an electrical signal, for example, an electrical signal having a differential amplitude, of 400 mV, which drives a transmission line, for example, a transmission line having a characteristic impedance of 100Ω to a differential signal, based on output signals Vd1 and Vd2 of the input circuit 61.

Note that the gain adjustment byte gain control signal generator 10 may be performed in the output circuit 62. In that case, however, it is necessary to perform the gain adjustment before an internal signal reaches the output limit to avoid a problem caused thereby. For this reason, it is desirable that the gain adjustment be performed in the input circuit 61 as in the present embodiment.

The transmitter 51 may comprise a circuit other than the input circuit 61 and the output circuit 62. For example, the transmitter 51 may comprise a serializer configured to convert parallel signals into serial signals, or a pre-emphasis circuit configured to modulate a signal in advance in consideration of a signal loss in a transmission line.

The receiver 52 of FIG. 16 may have a structure the same as that of the transmitter 51 of FIG. 17.

That is, the receiver 52 may comprise the input circuit 61 configured to receive and amplify input signals (received signals) Va1 and Va2 and the output circuit 62 configured to output signals based on output signals Vd1 and Vd2 of the input circuit 61.

Further, the gain of the input circuit 61 is controlled by the gain control signal Vc from the above-described gain control signal generator. In this way, as described above, it becomes possible to realize highly-reliable high-speed signal transmission.

The receiver 52 of FIG. 16 may comprise a circuit other than the input circuit 61 and the output circuit 62. For example, the receiver 52 may comprise, for example, a deserializer configured to convert serial signals into parallel signals, or an equalizer configured to compensate for a signal loss in a transmission lire.

Note that the signal transmission system using electrical signals, although assumed to be a signal transmission system using the transmitter 51 and the receiver 52 in the present embodiment, may be a system using only either one of the transmitter 51 and the receiver 52.

<Example of Optical Signal Transmission System>

Next, an example of a transmission system using optical signals will be described.

Figure 18:
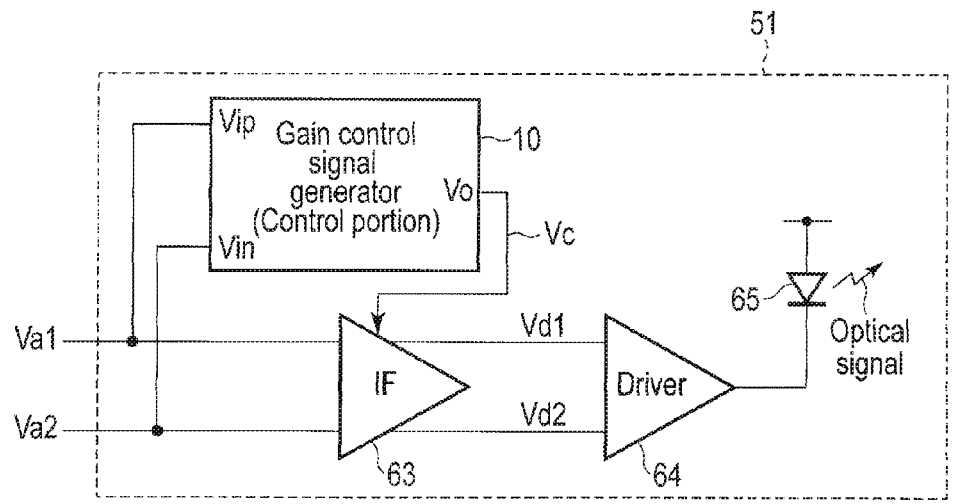
FIG. 18 is a diagram showing a transmitter for optical signal transmission.

For example, as shown in FIG. 18, the transmitter 51 for optical signal transmission comprises an interface circuit (interface: IF) 63 configured to amplify input signals Va1 and Va2, a drive circuit (driver) 64 configured to generate an electrical signal which drives a light-emitting element 65 based on output signals Vd1 and Vd2 of the interface circuit 63, and the light-emitting element (for example, a vertical cavity surface emitting laser [VCSEL]) 65 configured to convert an electrical signal (current signal) into an optical signal.

Input signals Va1 and Va2 of the interface circuit 63 are, for example, differential signals including a repetitious burst signal, and are capable of transmitting data of, for example, up to 25 Gbps.

The interface circuit 63 is configured to amplify input signals Va1 and Va2 the differential amplitude of which is 100 mV and generate output signals Vd1 and Vd2 the differential amplitude of which is 500 mV, for example. That is, the interface circuit 63 has a gain of approximately 14.0 dB.

Further, the gain of the interface circuit 63 is controlled by the gain control signal Vc from the gain control signal generator 10. For example, the following description is based on the assumption that the gain gradually decreases when the input amplitude is 200 mV or more, and that the gain of the interface circuit 63 obtained when the input amplitude is 400 mV is approximately 1.9 dB. With this configuration, it becomes possible to realize highly-reliable high-speed signal transmission.

The drive circuit 64 is configured to generate a current signal which drives the light-emitting element 65 based on output signals Vd1 and Vd2 of the interface circuit 63. The current signal includes, for example, a bias current (of, for example, 3 mA) for setting an operating point of the light-emitting element 65, namely, a laser, and a modulation current (having an amplitude of, for example, 5 mA) for modulating optical output. That is, the drive circuit 64 has a trans conductance of approximately 10 mS.

With this configuration, an optical signal (having an amplitude of, for example, 1 mW) is output from the light-emitting element 65. The optical signal is, for example, transmitted to the receiver 52 of FIG. 16 via an optical fiber.

In optical signal transmission in general, a single-channel signal is transmitted by a set of a light-emitting element and a light-receiving element to prevent increases in energy consumption and cost. Therefore, it is preferable that the output of the drive circuit 64 be a single-ended signal. However, the output of the drive circuit 64 may also be a differential signal, and a single-channel signal may also be transmitted by two sets of a light-emitting element and a light-receiving element.

The gain adjustment by the gain adjustment signal generator 10 may be performed in the drive circuit 64. In that case, however, it is necessary to perform the gain adjustment before an internal signal reaches the output limit to avoid a problem caused thereby. For this reason, it is preferable that the gain adjustment be performed in the interface circuit 63 as in the present embodiment.

Figure 19:
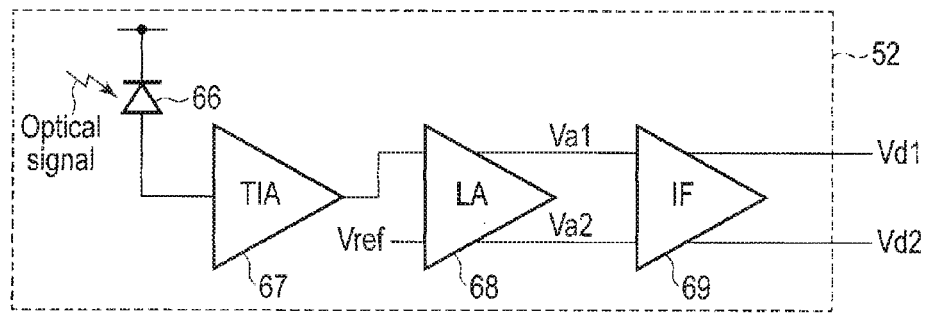
FIG. 19 is a diagram showing a receiver for optical signal transmission.

For example, as shown in FIG. 19, the receiver 52 for optical signal transmission comprises a light-receiving element (for example, a p-i-n photodiode [PD]) 66 configured to convert an optical signal into an electrical signal (current signal), a trans impedance amplifier (TIA) 67 configured to convert a current signal generated by the light-receiving element 66 into a voltage signal, a limiting amplifier (LA) 68 configured to amplify the output signal of the transimpedance amplifier 67, and an interface (IF) circuit 69 configured to drive a transmission line based on the output of the limiting amplifier 68.

The light-receiving element 66 is configured to receive an optical signal transmitted via an optical fiber and generate a current signal (having an amplitude of, for example, 200 μA).

The transimpedance amplifier 67 is configured to convert the current output generated by the light-receiving element 66 into a voltage signal (having an amplitude of, for example, 40 mV). In this case, the gain of the transimpedance amplifier 67 is 200Ω.

As described above, in the optical signal transmission in general, a single-channel signal is transmitted by a set of a light-emitting element and a light-receiving element. Therefore, it is preferable that the transimpedance amplifier 67 should perform single-ended input. However, it is also possible that a single-channel signal is transmitted by two sets of light-emitting element and a light-receiving element and that the transimpedance amplifier 67 performs differential input.

Further, the output signal of the transimpedance amplifier 67, although assumed to be a single-ended signal in the present embodiment, may be a differential signal.

The limiting amplifier 68 is configured to compare and amplify the output signal of the transimpedance amplifier 67 and the reference voltage Vref, convert the output of the transimpedance amplifier 67 from a single-ended signal to a differential signal, and amplify and output the signal. The amplitude of the differential signal is, for example, 800 mV, and in this case, the gain of the limiting amplifier 68 is approximately 32 dB.

Figure 20:
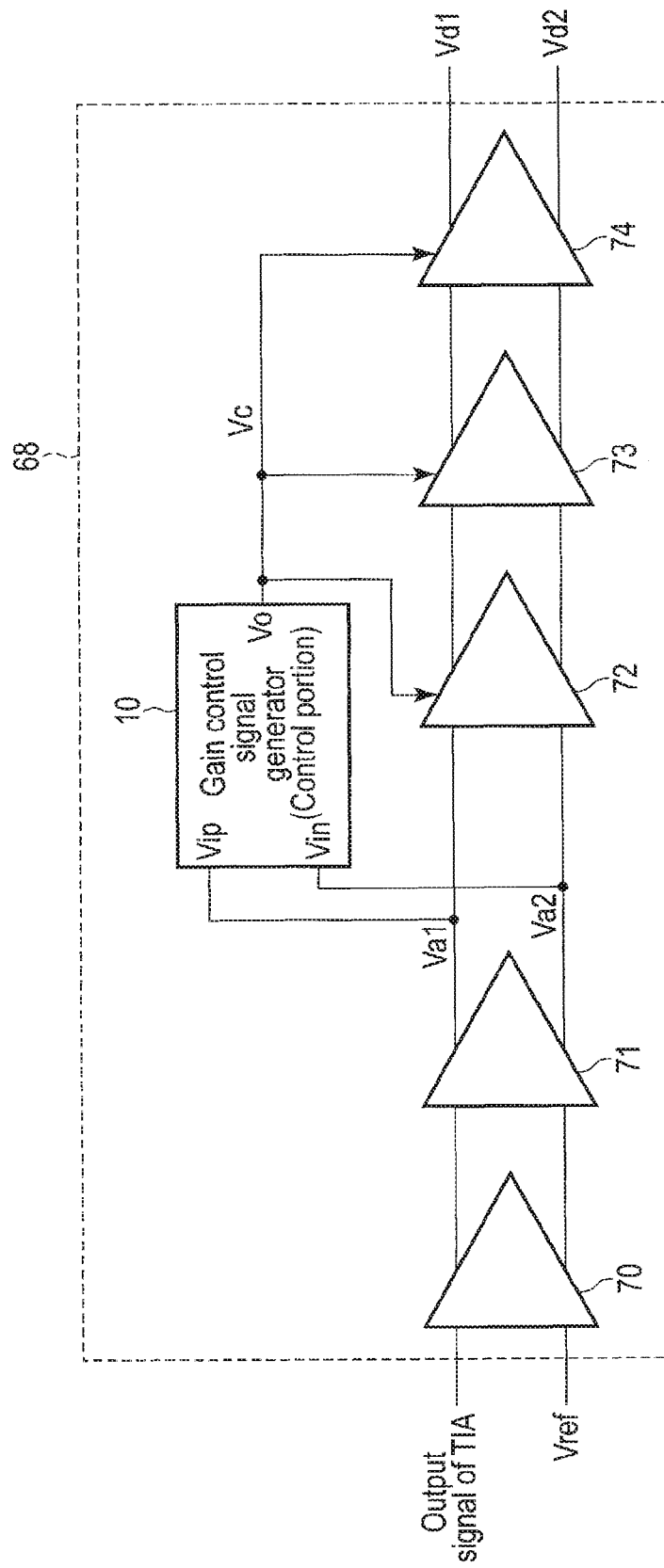
FIG. 20 is a diagram showing the inner structure of a limiting amplifier.

The limiting amplifier 68 comprises, for example, as shown in FIG. 20, five differential amplifiers 70 to 74 and the gain control signal generator 10 inside.

Differential amplifier 70 at the first step is configured to compare and amplify the output signal of the transimpedance amplifier 67 and the reference voltage Vref. The output signals of differential amplifier 70 at the first step are further amplified by the differential amplifiers at the second and subsequent steps. In this way, a single-ended signal is converted into differential signals, and then the signals are amplified.

The gain or signal generator 10 is configured to generate the gain control signal Vc from output signals Va1 and Va2 of the differential amplifier 71 at the second step and control the gains of differential amplifiers 72 to 74 at the third to fifth steps. In this way, it is possible to control the gain of the limiting amplifier 68 and thereby realize highly-reliable high-speed signal transmission.

It is desirable to use the output signals of the differential amplifiers at the second and subsequent steps as the input signals of the gain control signal generator 10 as shown in FIG. 20.

This is because, since the output signals of the differential amplifier at the first step have a normal phase signal and a reverse signal misaligned with each other or having amplitudes different from each other, there is a danger that the gain control signal generator 10 fails to detect the differential amplitude accurately.

Further, it is necessary to perform the gain adjustment before an internal signal reaches the output limit to avoid a problem caused thereby. Therefore, in the present embodiment, the output signals of the differential amplifier at the second step are used as the input signals of the gain control signal generator 10.

Similarly, although it is possible to perform the gain adjustment by the gain control signal generator 10 in the interface circuit 69 of FIG. 19, it is preferable that the gain control be performed in the limiting amplifier 68 to avoid a problem caused when an internal signal reaches the output limit.

The interface circuit 69 is configured to output electrical signals, for example, electrical signals having the differential amplitude of 400 mV, which drives a transmission line, for example, a transmission line having a characteristic impedance of 100Ω to a differential signal based on the output of the limiting amplifier 68.

<Example of Application to Storage System>

Figure 21:
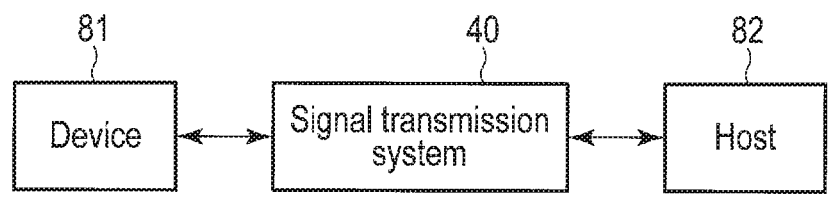
FIG. 21 is a diagram showing a storage system as an application example.

FIG. 21 is a diagram showing an example of application of the above-described signal transmission system to a storage system.

The storage system comprises a device (such as an SSD or a hard disk) 81 and a host (such as a computer or a server) 82 configured to read and write data to the device 81 which are connected to each other by the above-described signal transmission system 40.

In the storage system, the device 81 and the host 82 are connected according to an interface standard such as the above-mentioned SATA or SAS standard. However, since an GOB signal and an NRZ signal are used respectively as the repetitious burst signal and the data signal in these interface standards, it is disadvantageously likely that signals cannot be transmitted accurately in the idle period and the burst period as the signals are amplified and consequently the reliability of signal transmission decreases significantly.

By using the signal transmission system of the present embodiment, it is possible to resolve these issues and thereby improve the reliability of signal transmission significantly.

(4) Modification

From the above, according to the embodiments, it is possible to improve the reliability of signal transmission.

Note that the present invention is not necessarily limited to each of the above-described embodiments. The blocks and circuits described in the embodiments, the circuit elements in the blocks and circuits, and other components are presented by way of example only and may be appropriately replaced with substitutes having similar functions.

For example, although the case of using an MOS transistor has been described above, a transistor other than the MOS transistor such as a field-effect transistor, a bipolar transistor or a Bi-CMOS transistor may be used as well. Further, the light-emitting element may include various other light emitting elements such as a light-emitting diode and a semiconductor laser. Still further, the light-receiving element may include various other light-receiving elements such as a PIN photodiode, an MSM photodiode, an avalanche photodiode, and a photoconductor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An amplification circuit comprising:
   an amplifier which has a gain based on a gain control signal and which amplifies an input signal by the gain; and
   a gain control signal generator which outputs the gain control signal for increasing the gain after decreasing the gain based on an amplitude of the input signal, when the amplitude of the input signal is detected,
   wherein the gain control signal generator comprises:
   an amplitude detector which detects the amplitude of the input signal;
   a comparator which generates the gain control signal by comparing an output value of the amplitude detector and a first reference value; and
   an integration circuit which generates the first reference value based on a time integration value obtained by integrating a difference between the gain control signal and a second reference value, wherein the integration circuit executes feedback control to make a time-averaged value of the gain control signal approach the second reference value.

2. The circuit of claim 1, wherein the gain control signal generator increases the gain from a minimum value toward an initial value after decreasing the gain from the initial value to the minimum vale.

3. The circuit of claim 2, wherein a time in which the gain changes from the initial value to the minimum value is shorter than a time in which the gain changes from the minimum value to the initial value.

4. The circuit of claim 2, wherein the minimum value decreases as the amplitude increases.

5. The circuit of claim 4, wherein the minimum value is less than or equal to 50% of the initial value when the amplitude is a maximum amplitude of a system.

6. The circuit of claim 1, wherein the input signal comprises:
   a repetitious burst signal including a burst period in which a signal transitions between low and high repeatedly and an idle period in which a signal remains unchanged at an intermediate level between low and high; and
   a data signal including a data period in which a signal transitions between low and high repeatedly.

7. The circuit of claim 6, wherein the input signal includes an out-of-band (OOB) signal and a non-return-to-zero (NRZ) signal.

8. The circuit of claim 6, wherein the gain control signal generator increases the gain from a minimum value toward an initial value after decreasing the gain from the initial value to the minimum value, in the burst period and the data period.

9. The circuit of claim 8, wherein a time in which the gain changes from the initial value to the minimum value is shorter than a time in which the gain changes from the minimum value to the initial value.

10. The circuit of claim 8, wherein the minimum value decreases as the amplitude increases.

11. The circuit of claim 10, wherein the minimum value is less than or equal to 50% of the initial value when the amplitude is a maximum amplitude of a system.

12. The circuit of claim 8, wherein the burst period ends while the gain has the minimum value or while the gain changes from the minimum value toward the initial value.

13. The circuit of claim 12, wherein the burst period ends before a point of time when the gain increases from the minimum value and recovers to a 50% of a difference between the initial value and the minimum value.

14. The circuit of claim 8, wherein the data period is longer than a time in which the gain changes from the minimum value to the initial value.

15. The circuit of claim 8, wherein the gain increases from the minimum value and recovers to a 50% or more of a difference between the initial value and the minimum value at a point of time when $1/10$ of a transmission speed adjustment time passes after the data period starts, and the point of time is in the data period.

16. A transmitter comprising:
   a light-emitting element which converts a current signal into an optical signal;
   the amplification circuit according to claim 1, wherein the amplifier is a first amplifier as an interface which receives a voltage signal; and
   a second amplifier which generates the current signal based on an output signal of the first amplifier.

17. A receiver comprising:
   a light-receiving element which converts an optical signal into a current signal;
   a first amplifier which converts the current signal into a voltage signal;
   a second amplifier which limits a level of the voltage signal within a certain range; and
   a third amplifier as an interface which receives the voltage signal from the second amplifier,
   wherein the second amplifier comprises the amplification circuit of claim 1.

18. A signal transmission system for executing signal transmission between first and second converters by using an optical signal, the signal transmission system comprising:
   a first converter which converts an electrical signal into the optical signal; and
   a second converter which converts the optical signal into the electrical signal,
   wherein at least one of the first and second converters comprises the amplification circuit of claim 1.

19. The circuit of claim 1, wherein:
   the comparator includes an inverting input terminal, a non-inverting input terminal, and a non-inverting output terminal,
   the inverting input terminal receives the output value of the amplitude detector,
   the non-inverting input terminal receives the first reference value from the integration circuit, and
   the non-inverting output terminal supplies the gain control signal to the integration circuit.

* * * * *